United States Patent
Sato

(10) Patent No.: US 12,140,879 B2
(45) Date of Patent: Nov. 12, 2024

(54) MEASUREMENT METHOD, MEASUREMENT APPARATUS, AND MARK

(71) Applicant: KIOXIA Corporation, Tokyo (JP)

(72) Inventor: Takashi Sato, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 358 days.

(21) Appl. No.: 17/547,046

(22) Filed: Dec. 9, 2021

(65) Prior Publication Data

US 2023/0081143 A1 Mar. 16, 2023

(30) Foreign Application Priority Data

Sep. 16, 2021 (JP) ................... 2021-151220

(51) Int. Cl.
*G03F 9/00* (2006.01)
(52) U.S. Cl.
CPC .......... *G03F 9/7088* (2013.01); *G03F 9/7069* (2013.01)
(58) Field of Classification Search
CPC .. G03F 9/7088; G03F 9/7069; G03F 7/70683; G03F 7/70633
See application file for complete search history.

(56) References Cited

U.S. PATENT DOCUMENTS 6,023,320 A * 2/2000 Kawashima ........ G03F 7/70358
356/400
6,426,508 B1 * 7/2002 Kosugi ............... G03F 7/70358
250/548

(Continued)

FOREIGN PATENT DOCUMENTS

CN 104180768 A 12/2014
JP H8-137087 A 5/1996
(Continued)

OTHER PUBLICATIONS

Cheuk Wun Wong et al., "Self-referenced and self-calibrated MoiréOVL target design and applications," Proc. SPIE 11611, vol. 1161122, pp. 1161122-1 to 1161122-8 (Feb. 22, 2021).

*Primary Examiner* — David A Vanore
(74) *Attorney, Agent, or Firm* — Finnegan, Henderson, Farabow, Garrett & Dunner, LLP

(57) ABSTRACT

According to one embodiment, a measurement method includes generating mark position information, determining at least one of a first arrangement pattern or a second arrangement pattern, and calculating displacement between a first member and a second member. The mark position information is generated after the second member is formed on the first member, and indicates a relative positional relationship between a first alignment mark formed on the first member and including bright portions and dark portions, and a second alignment mark formed on the second member and including the bright portions and the dark portions. The first arrangement pattern indicates an arrangement pattern of bright portions and dark portions of the first alignment mark. The second arrangement pattern indicates an arrangement pattern of the bright portions and the dark portions of the second alignment mark. The first arrangement pattern is determined on the basis of captured data of a reference mark formed in a region different from the region where the first alignment mark is formed and the region where the second alignment mark is formed. The displacement is calculated on the basis of the mark position information and at least one of the first arrangement pattern or the second arrangement pattern.

14 Claims, 12 Drawing Sheets

(56) References Cited

U.S. PATENT DOCUMENTS

| | | | |
|---|---|---|---|
| 6,992,766 B2 | 1/2006 | Tanaka et al. | |
| 11,815,348 B2* | 11/2023 | Sato | G03F 1/42 |
| 2004/0181303 A1* | 9/2004 | Walmsley | G06F 21/554 |
| | | | 700/121 |
| 2006/0044568 A1* | 3/2006 | Weiss | G03F 7/70633 |
| | | | 356/509 |
| 2007/0194466 A1* | 8/2007 | Yamaguchi | G03F 9/7076 |
| | | | 257/E23.179 |
| 2007/0279630 A1* | 12/2007 | Kandel | G03F 7/70633 |
| | | | 356/401 |
| 2010/0053616 A1* | 3/2010 | Yeh | G03F 9/7076 |
| | | | 257/E23.179 |
| 2012/0328725 A1* | 12/2012 | Minoda | G03F 7/0002 |
| | | | 425/150 |
| 2014/0346700 A1* | 11/2014 | Sato | G03F 9/7088 |
| | | | 425/169 |
| 2015/0062553 A1* | 3/2015 | Miyaharu | G03F 9/7042 |
| | | | 355/72 |
| 2017/0248794 A1* | 8/2017 | Eurlings | G03F 7/70616 |
| 2019/0067204 A1* | 2/2019 | Sun | G01B 21/20 |
| 2020/0301293 A1* | 9/2020 | Mitsugi | G03F 1/42 |
| 2021/0095957 A1* | 4/2021 | Swillam | G01B 11/272 |

FOREIGN PATENT DOCUMENTS

| | | |
|---|---|---|
| JP | 3634558 B2 | 1/2005 |
| JP | 4165871 B2 | 8/2008 |
| JP | 2020-38164 A | 3/2020 |

\* cited by examiner

MEASUREMENT METHOD, MEASUREMENT APPARATUS, AND MARK

CROSS-REFERENCE TO RELATED APPLICATIONS

This application is based upon and claims the benefit of priority from Japanese Patent Application No. 2021-151220, filed on Sep. 16, 2021; the entire contents of which are incorporated herein by reference.

FIELD

Embodiments described herein relate generally to a measurement method, a measurement apparatus, and a mark.

BACKGROUND

In a manufacturing process of a semiconductor device, a technique of measuring displacement between a plurality of layers constituting the semiconductor device and displacement between a member to be processed and a template in nanoimprinting using an alignment mark is applied. For example, there is a technique of measuring displacement between a lower layer and an upper layer by forming a mark in which bright portions and dark portions are arranged in a line-and-space shape in each of the lower layer and the upper layer and observing moiré generated by overlapping the mark of the lower layer with the mark of the upper layer.

DETAILED DESCRIPTION

According to one embodiment, a measurement method is provided. The measurement method includes generating mark position information, determining at least one of a first arrangement pattern or a second arrangement pattern, and calculating displacement between a first member and a second member. The mark position information is generated after the second member is formed on the first member, and indicates a relative positional relationship between a first alignment mark formed on the first member and including bright portions and dark portions, and a second alignment mark formed on the second member and including the bright portions and the dark portions. The first arrangement pattern indicates an arrangement pattern of bright portions and dark portions of the first alignment mark. The second arrangement pattern indicates an arrangement pattern of the bright portions and the dark portions of the second alignment mark. The first arrangement pattern is determined on the basis of captured data of a reference mark formed in a region different from the region where the first alignment mark is formed and the region where the second alignment mark is formed. The displacement is calculated on the basis of the mark position information and at least one of the first arrangement pattern or the second arrangement pattern.

Hereinafter, exemplary embodiments of the present invention will be explained below with reference to the drawings. Note that the present invention is not limited by the embodiments. In addition, constituent elements in the embodiments include those that can be easily assumed by those skilled in the art or those that are substantially the same.

First Embodiment

In the present embodiment, a technique for measuring displacement between a plurality of layers constituting a semiconductor device in a manufacturing process of the semiconductor device will be described.

Figure 1:
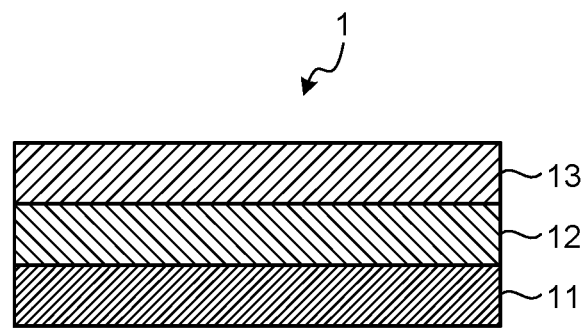
FIG. 1 is a cross-sectional view schematically illustrating an example of a configuration of a semiconductor device according to a first embodiment.
Figure 1:
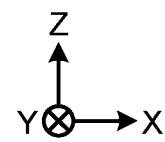

FIG. 1 is a cross-sectional view schematically illustrating an example of a configuration of a semiconductor device 1 according to a first embodiment. In the drawing, the X axis corresponds to the left-right direction of the paper surface, the Y axis corresponds to the direction orthogonal to the paper surface, and the Z axis corresponds to the direction (stack direction) orthogonal to the X axis and the Y axis.

The semiconductor device 1 illustrated in FIG. 1 includes a substrate 11, a first layer 12 (an example of the first member), and a second layer 13 (an example of the second member). The first layer 12 is formed on the substrate 11, and the second layer 13 is formed on the first layer 12.

Specific configurations of the substrate 11, the first layer 12, and the second layer 13 should be appropriately determined according to the type of the semiconductor device 1. For example, the substrate 11 may be a silicon substrate or the like, the first layer 12 may be a silicon oxide film or the like on which a wiring layer having a predetermined circuit pattern is formed, and the second layer 13 may be a resist or the like. In this case, the semiconductor device 1 is finally obtained by peeling the second layer 13. In addition, one or more layers may be formed on the second layer 13. In the present embodiment, a case where displacement between the first layer 12 and the second layer 13 is measured will be described.

Figure 2:
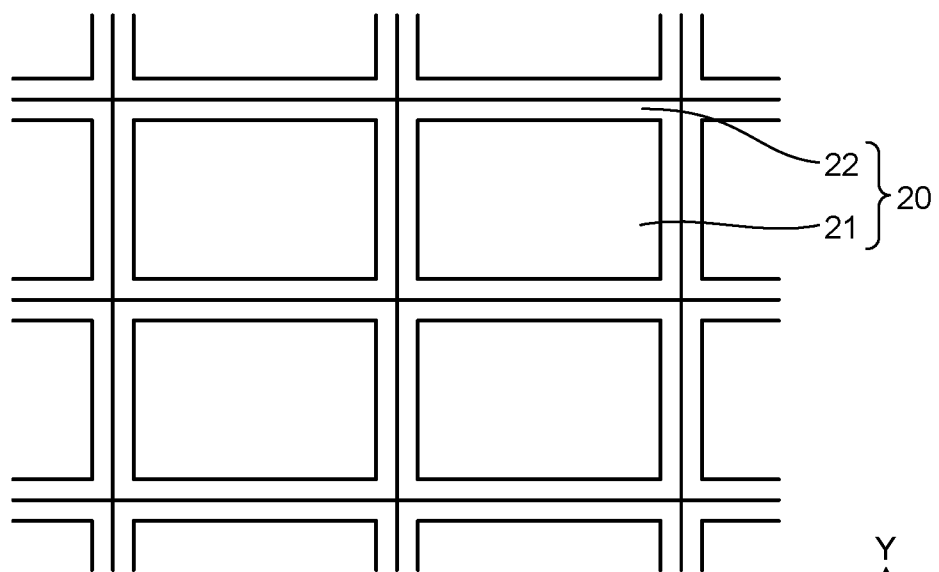
FIG. 2 is a top view illustrating an example of a configuration of a first layer and a second layer according to the first embodiment.
Figure 2:
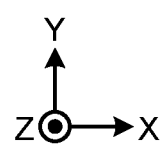

FIG. 2 is a top view illustrating an example of a configuration of the first layer 12 and the second layer 13 according to the first embodiment. As illustrated in FIG. 2, a plurality of shot regions 20 is provided on the upper surface of each of the first layer 12 and the second layer 13. Each shot region 20 includes a device region 21 and a kerf region 22. The device region 21 is a region for forming a predetermined circuit pattern, a resist pattern, and the like. The kerf region 22 is a frame-shaped region provided in a peripheral portion of the device region 21. When the processing on the device region 21 is completed, dicing is performed in the kerf region 22, and a plurality of chips each having a circuit pattern or the like is formed. In the kerf region 22, marks (a first mark and a second mark to be described later) for measuring displacement between the first layer 12 and the second layer 13 are formed.

Figure 3:
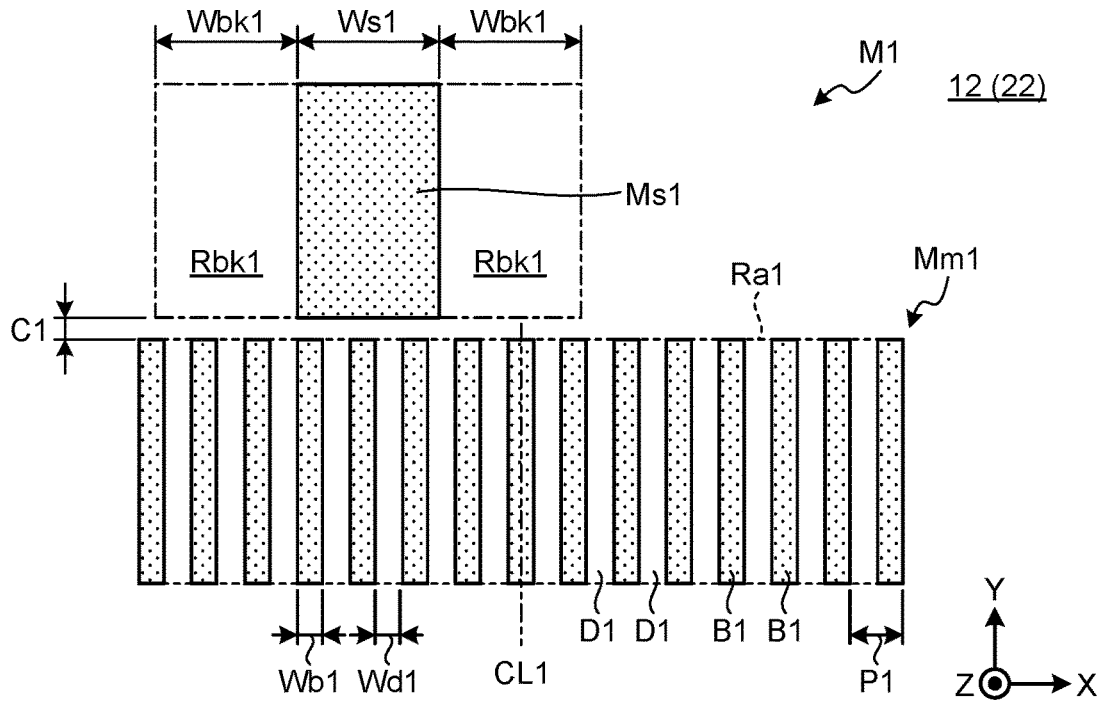
FIG. 3 is a top view illustrating an example of a configuration of a first mark according to the first embodiment.
Figure 4:
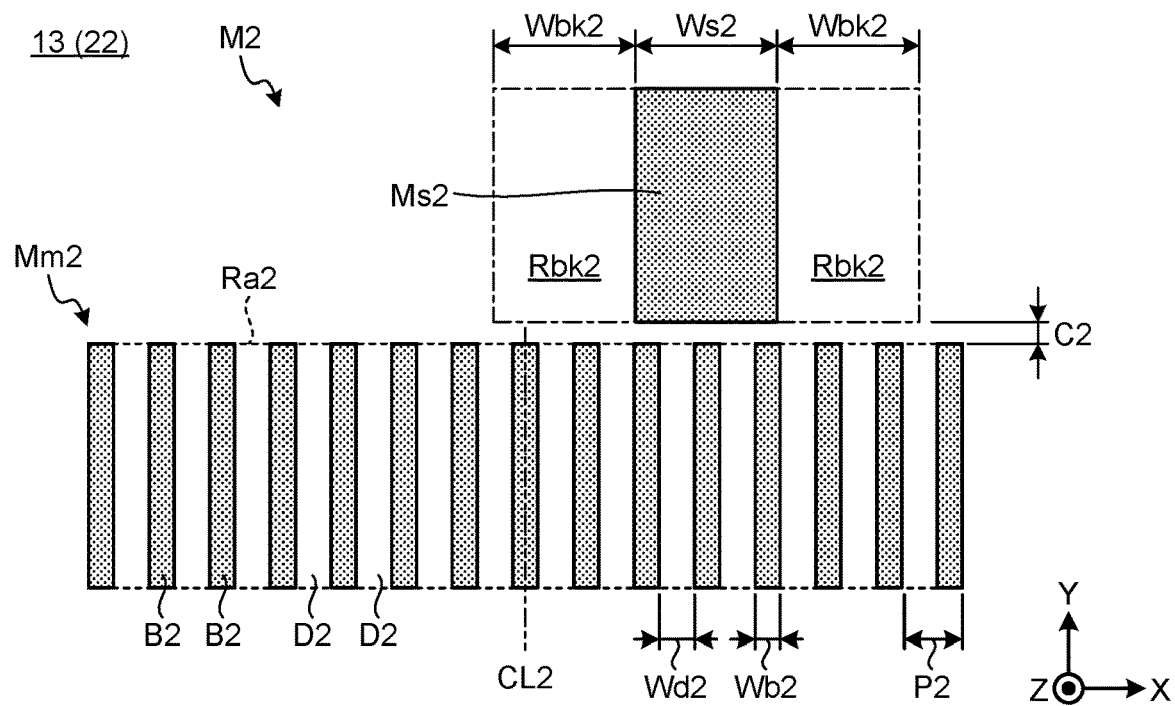
FIG. 4 is a top view illustrating an example of a configuration of a second mark according to the first embodiment.

FIG. 3 is a top view illustrating an example of a configuration of a first mark M1 according to the first embodiment. FIG. 4 is a top view illustrating an example of a configuration of a second mark M2 according to the first embodiment. The first mark M1 is formed in the kerf region 22 of the first layer 12. The second mark M2 is formed in the kerf region 22 of the second layer 13.

As illustrated in FIG. 3, the first mark M1 includes a first moiré mark Mm1 (an example of the first alignment mark) and a first reference mark Ms1. The first moiré mark Mm1 is a mark for generating moiré by overlapping with a second moiré mark Mm2 (FIG. 4) to be described later, and includes a plurality of bright portions B1 and a plurality of dark portions D1. The bright portions B1 are parts having a higher light reflection intensity than the dark portions D1. How to specifically form the bright portions B1 and the dark portions D1 should be appropriately selected according to the configuration of the semiconductor device 1. For example, the bright portions B1 may be configured by a region in which a metal such as tungsten is disposed, and the dark portions D1 may be configured by a region in which no metal is disposed (a silicon oxide film or the like is exposed).

Each of the bright portions B1 and each of the dark portions D1 according to the present embodiment have a linear shape extending in the Y axis direction (an example of a first direction). The plurality of bright portions B1 and the plurality of dark portions D1 are alternately arranged in the X axis direction (an example of a second direction) in a first region Ra1 having a predetermined area. The first region Ra1 is a region surrounded by a broken line in FIG. 3.

The first reference mark Ms1 is a mark for determining an arrangement pattern of the bright portions B1 and the dark portions D1 in the first moiré mark Mm1. The arrangement pattern here indicates a positional relationship between the bright portions B1 and the dark portions D1 in the first region Ra1. The arrangement pattern may be a normal pattern determined in advance by design data or the like, or an inverted pattern in which the positional relationship between the bright portions B1 and the dark portions D1 is inverted with respect to the normal pattern. It is assumed that the first moiré mark Mm1 illustrated in FIG. 3 is a normal pattern (an inverted pattern will be described later).

The first reference mark Ms1 has optical characteristics corresponding to one of the bright portions B1 or the dark portions D1 in the first moiré mark Mm1. The optical characteristics here may be, for example, a reflectance for inspection light having a predetermined wavelength (for example, a wavelength from a visible light region to a near infrared region). The first reference mark Ms1 according to the present embodiment has optical characteristics (for example, a reflectance in which an error from the reflectance of the bright portions B1 is equal to or less than a threshold value) corresponding to the bright portions B1, and can be made of, for example, the same material as the bright portions B1. A first margin region Rbk1 having optical characteristics different from those of the first reference mark Ms1 is provided around the first reference mark Ms1 (in the present embodiment, a region adjacent in the X axis direction). The first margin region Rbk1 according to the present embodiment has optical characteristics corresponding to the dark portions D1. As illustrated in FIG. 3, a plurality of (two in the present embodiment) first margin regions Rbk1 may be provided, or only one first margin region Rbk1 may be provided in one of the regions adjacent to the first reference mark Ms1.

In FIG. 3, P1 indicates the arrangement pitch of the bright portions B1 and the dark portions D1 in the first moiré mark Mm1, Wb1 indicates the width of the bright portion B1 in the X axis direction, Wd1 indicates the width of the dark portion D1 in the X axis direction, and CL1 indicates the center position of the first region Ra1 in the X axis direction. In addition, C1 indicates a separation distance between the first moiré mark Mm1 (first region Ra1) and the first reference mark Ms1, Ws1 indicates the width of the first reference mark Ms1 in the X axis direction, and Wbk1 indicates the width of the first margin region Rbk1 in the X axis direction.

An arrangement pitch P1 of the first moiré mark Mm1 is different from an arrangement pitch P2 (FIG. 4) of the second moiré mark Mm2 to be described later, and in the present embodiment, a relationship of P1<P2 is established. A separation distance C1 is preferably 20 μm or less. As a result, the first moiré mark Mm1 and the first reference mark Ms1 can be easily accommodated in one captured region, and the efficiency of image processing can be improved. The width Ws1 of the first reference mark Ms1 is preferably larger than the width Wb1 of the bright portions B1 and the width Wd1 of the dark portions D1, and is equal to or greater than 1.5 μm. As a result, when visible light or near infrared light is used as the inspection light, the optical characteristics of the first reference mark Ms1 (for example, the light intensity of the reflected light generated by irradiating the first reference mark Ms1 with the inspection light, and the like) can be accurately measured. From the similar viewpoint, the width Wbk1 of the first margin region Rbk1 is preferably larger than the width Wb1 of the bright portions B1 and the width Wd1 of the dark portions D1, and is equal to or greater than 1.5 μm.

With the above configuration, the optical characteristics of the first reference mark Ms1 are measured using the captured data of the first reference mark Ms1, and a region having optical characteristics equivalent to those of the first reference mark Ms1 in the first region Ra1 can be determined as the bright portions B1 of the first moiré mark Mm1. That is, the arrangement pattern of the bright portions B1 and the dark portions D1 in the first moiré mark Mm1 can be determined on the basis of the captured data of the first reference mark Ms1.

As illustrated in FIG. 4, the second mark M2 includes the second moiré mark Mm2 (an example of the second alignment mark) and a second reference mark Ms2. The second moiré mark Mm2 is a mark for generating moiré by overlapping with the first moiré mark Mm1 (FIG. 3), and includes a plurality of bright portions B2 and a plurality of dark portions D2. The bright portions B2 are parts having a higher light reflection intensity than the dark portions D2. How to specifically form the bright portions B2 and the dark portions D2 should be appropriately selected according to the configuration of the semiconductor device 1. For example, the bright portions B2 can be configured by a slit (opening) formed in a material (for example, resist) constituting the second layer 13, and the dark portions D1 can be configured by a region where no slit is formed (for example, resist or the like remains).

Similarly to the bright portions B1 and the dark portions D1 of the first reference mark Ms1, each of the bright portions B2 and each of the dark portions D2 according to the present embodiment has a linear shape extending in the Y axis direction. The plurality of bright portions B2 and the plurality of dark portions D2 are alternately arranged in the X axis direction in a second region Ra2 having a predetermined area. The second region Ra2 is a region surrounded by a broken line in FIG. 4.

The second reference mark Ms2 is a mark for determining the arrangement pattern of the bright portions B2 and the dark portions D2 in the second moiré mark Mm2. The arrangement pattern here indicates the positional relationship between the bright portions B2 and the dark portions D2 in the second region Ra2, and includes a predetermined normal pattern and an inverted pattern in which the positional relationship between the bright portions B2 and the dark portions D2 is inverted with respect to the normal pattern. The second moiré mark Mm2 illustrated in FIG. 4 corresponds to the normal pattern.

The second reference mark Ms2 has optical characteristics corresponding to one of the bright portions B2 or the dark portions D2 in the second moiré mark Mm2. The second reference mark Ms2 according to the present embodiment has optical characteristics corresponding to the bright portions B2. A second margin region Rbk2 having optical characteristics different from those of the second reference mark Ms2 is provided around the second reference mark Ms2. The second margin region Rbk2 according to the present embodiment has optical characteristics corresponding to the dark portions D2.

In FIG. 4, P2 indicates the arrangement pitch of the bright portions B2 and the dark portions D2 in the second moiré mark Mm2, Wb2 indicates the width of the bright portion B2 in the X axis direction, Wd2 indicates the width of the dark portion D2 in the X axis direction, and CL2 indicates the center position of the second region Ra2 in the X axis direction. In addition, C2 represents a separation distance between the second moiré mark Mm2 (second region Ra2) and the second reference mark Ms2, Ws2 indicates the width of the second reference mark Ms2 in the X axis direction, and Wbk2 indicates the width of the second margin region Rbk2 in the X axis direction.

The arrangement pitch P2 of the second moiré mark Mm2 is different from the arrangement pitch P1 (FIG. 3) of the first moiré mark Mm1, and in the present embodiment, a relationship of P1<P2 is established. A separation distance C2 is preferably 20 µm or less similarly to the separation distance C1 in the first mark M1. The width Ws2 of the second reference mark Ms2 and the width Wbk2 of the second margin region Rbk2 are preferably larger than the width Wb2 of the bright portions B2 and the width Wd2 of the dark portions D2, and are equal to or greater than 1.5 µm.

With the above configuration, the optical characteristics of the second reference mark Ms2 can be measured using the captured data of the second reference mark Ms2, and a region having optical characteristics equivalent to those of the second reference mark Ms2 in the second region Ra2 can be determined as the bright portions B2 of the second moiré mark Mm2. That is, the arrangement pattern of the bright portions B2 and the dark portions D2 in the second moiré mark Mm2 can be determined on the basis of the captured data of the second reference mark Ms2.

Figure 5:
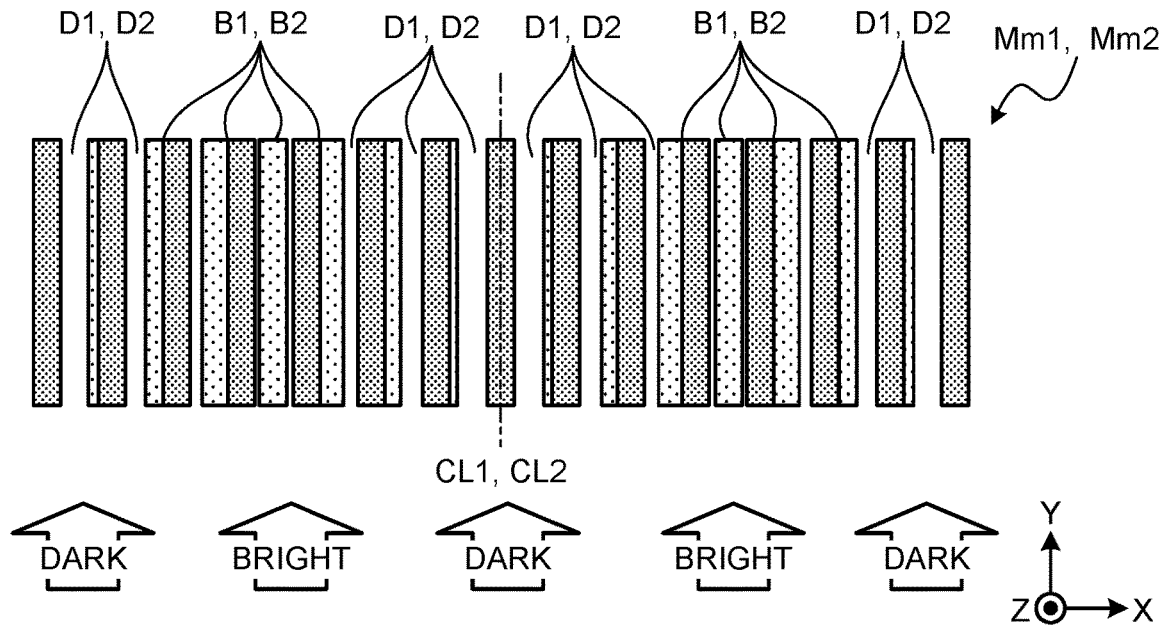
FIG. 5 is a diagram illustrating an example of moiré in a case where a first moiré mark and a second moiré mark according to the first embodiment are at normal positions.

FIG. 5 is a diagram illustrating an example of moiré in a case where the first moiré mark Mm1 and the second moiré mark Mm2 according to the first embodiment are at normal positions. After the second layer 13 in which the second moiré mark Mm2 is formed is formed on the first layer 12 in which the first moiré mark Mm1 is formed, when the region where the first moiré mark Mm1 and the second moiré mark Mm2 overlap is observed from the upper surface side, moiré in accordance with the positional relationship between the bright portions B1 and B2 and the dark portions D1 and D2 is observed. FIG. 5 illustrates a state in which the first moiré mark Mm1 and the second moiré mark Mm2 are at predetermined normal positions. Here, the normal position is a state in which the center line CL1 of the first moiré mark Mm1 and the center line CL2 of the second moiré mark Mm2 coincide with each other or a displacement amount therebetween is within the threshold value. Note that the normal position is not limited thereto.

In FIG. 5, "bright" and "dark" indicate bright portions and dark portions of moiré. As illustrated in FIG. 5, a part where the bright portions B1 and B2 of both the moiré marks Mm1 and Mm2 are dense becomes a bright portion of the moiré, and a part where the dark portions D1 and D2 of both the moiré marks Mm1 and Mm2 are dense becomes a dark portion of the moiré. The displacement between the first layer 12 and the second layer 13 can be measured on the basis of the positions of the bright portion and the dark portion of the moiré.

Figure 6:
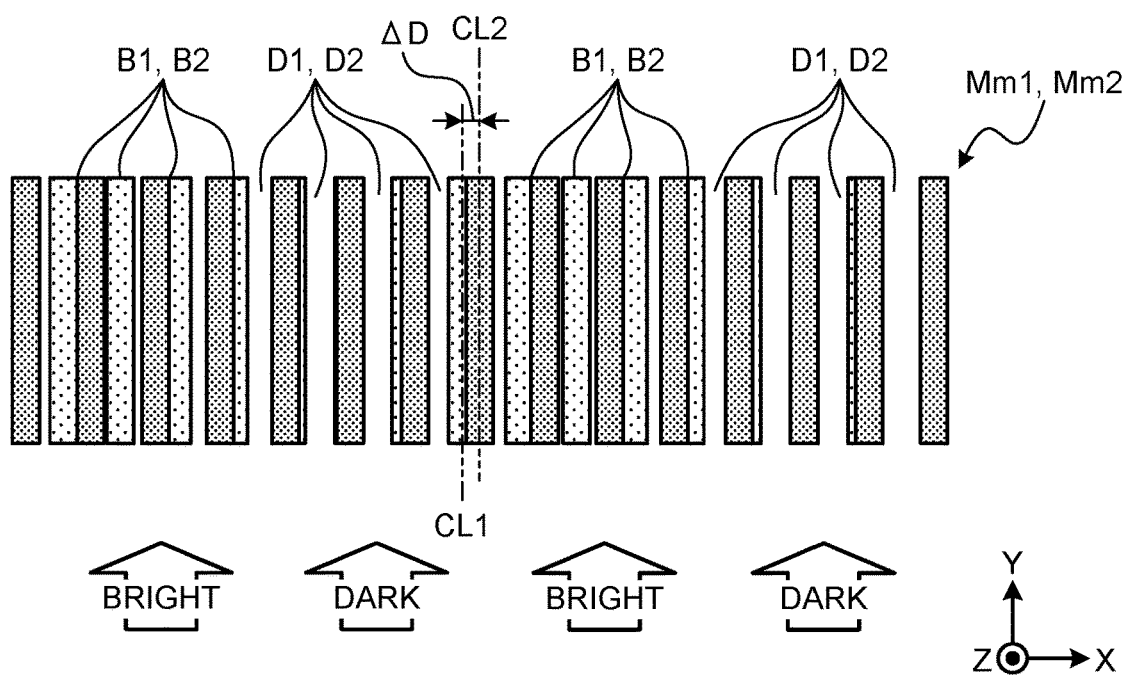
FIG. 6 is a diagram illustrating an example of moiré in a case where the first moiré mark and the second moiré mark according to the first embodiment are not at normal positions.

FIG. 6 is a diagram illustrating an example of moiré in a case where the first moiré mark Mm1 and the second moiré mark Mm2 according to the first embodiment are not at normal positions. FIG. 6 illustrates a state in which the center line CL2 of the second moiré mark Mm2 is displaced rightward in the drawing by the distance ΔD with respect to the normal position (position of the center line CL1). When the relative positional relationship between the moiré marks Mm1 and Mm2 displaces in this manner, the positions of the bright portion and the dark portion of the moiré change as illustrated in the comparison of the positions of "bright" and "dark" in FIGS. 5 and 6. The displacement between the first layer 12 and the second layer 13 can be measured on the basis of such a change in moiré.

In the above description, an example in which the dark portion of the moiré is located at the center when the first moiré mark Mm1 and the second moiré mark Mm2 are at the normal positions (FIG. 5) is illustrated, but the arrangement of the moiré is not limited thereto. For example, when the first moiré mark Mm1 and the second moiré mark Mm2 are at normal positions, the bright portion of the moiré may be located at the center. In addition, in the above description, an example in which the first moiré mark Mm1 and the second moiré mark Mm2 are formed in a line-and-space shape with a constant pitch is illustrated, but the present invention is not limited to the case where the first moiré mark Mm1 and the second moiré mark Mm2 are formed with a constant pitch as long as the first moiré mark Mm1 and the second moiré mark Mm2 are repeated patterns. In addition, the patterns of the first moiré mark Mm1 and the second moiré mark Mm2 are not limited to the line-and-space shape, and may be, for example, a checkered lattice shape or the like.

Here, the inversion of the arrangement pattern of the bright portions B1 and B2 and the dark portions D1 and D2 will be described. The arrangement pattern of the bright portions B1 and the dark portions D1 in the first moiré mark Mm1 or the arrangement pattern of the bright portions B2 and the dark portions D2 in the second moiré mark Mm2 may be inverted at the time of processing (for example, at the time of forming a pattern by photolithography, or the like) for each of the layers 12 and 13.

Figure 7:
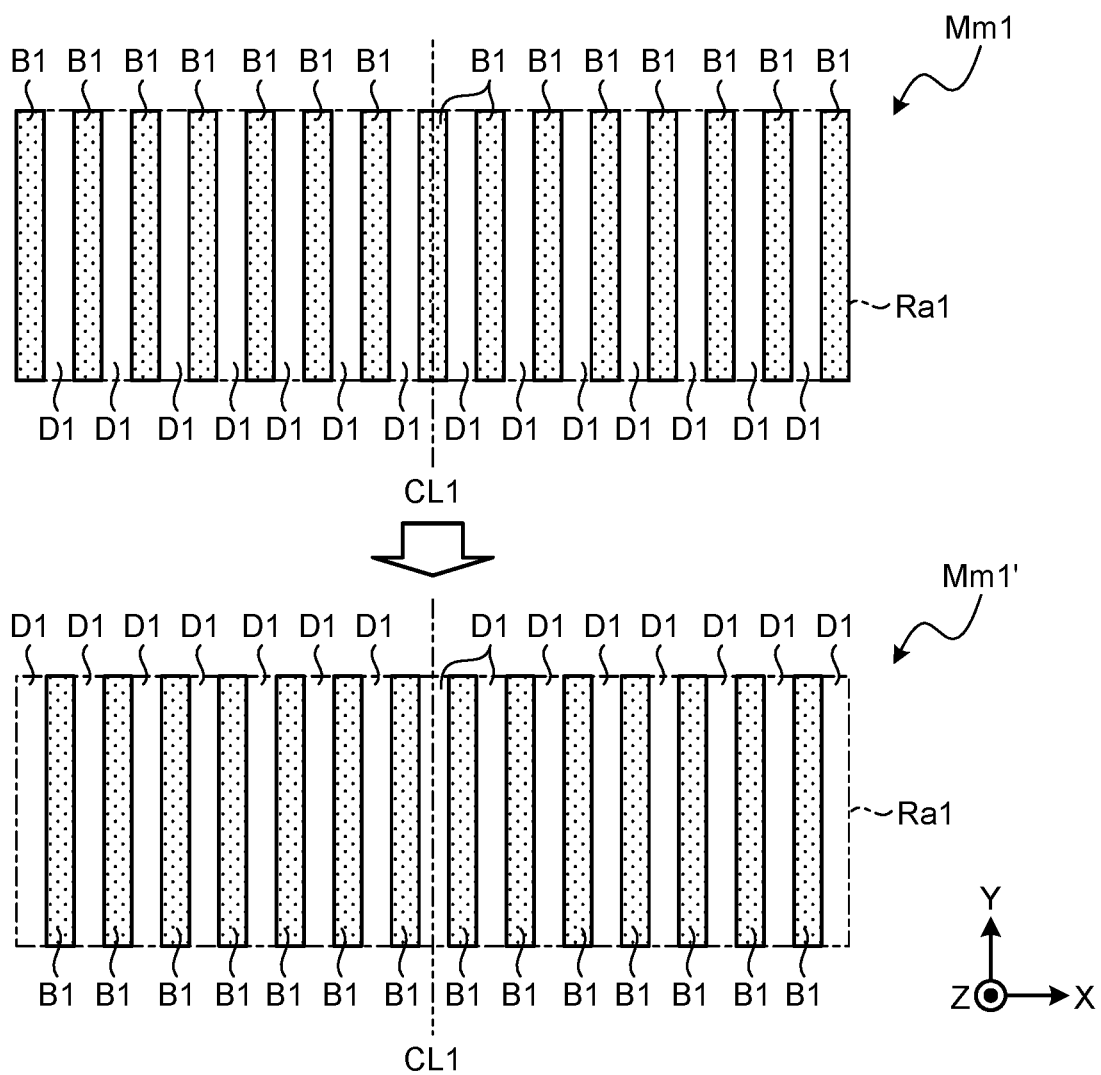
FIG. 7 is a diagram illustrating comparison between the first moiré mark that is a normal pattern and the first moiré mark that is an inverted pattern according to the first embodiment.

FIG. 7 is a diagram illustrating comparison between the first moiré mark Mm1 that is a normal pattern and a first moiré mark Mm1' that is an inverted pattern according to the first embodiment. As illustrated in FIG. 7, the positional relationship between the bright portions B1 and the dark portions D1 in the first region Ra1 of the first moiré mark Mm1' corresponding to the inverted pattern is inverted with respect to the positional relationship between the bright portions B1 and the dark portions D1 in the first region Ra1 of the first moiré mark Mm1 corresponding to the normal pattern. The first moiré mark of the present embodiment has a normal pattern (Mm1) or an inverted pattern (Mm1').

Figure 8:
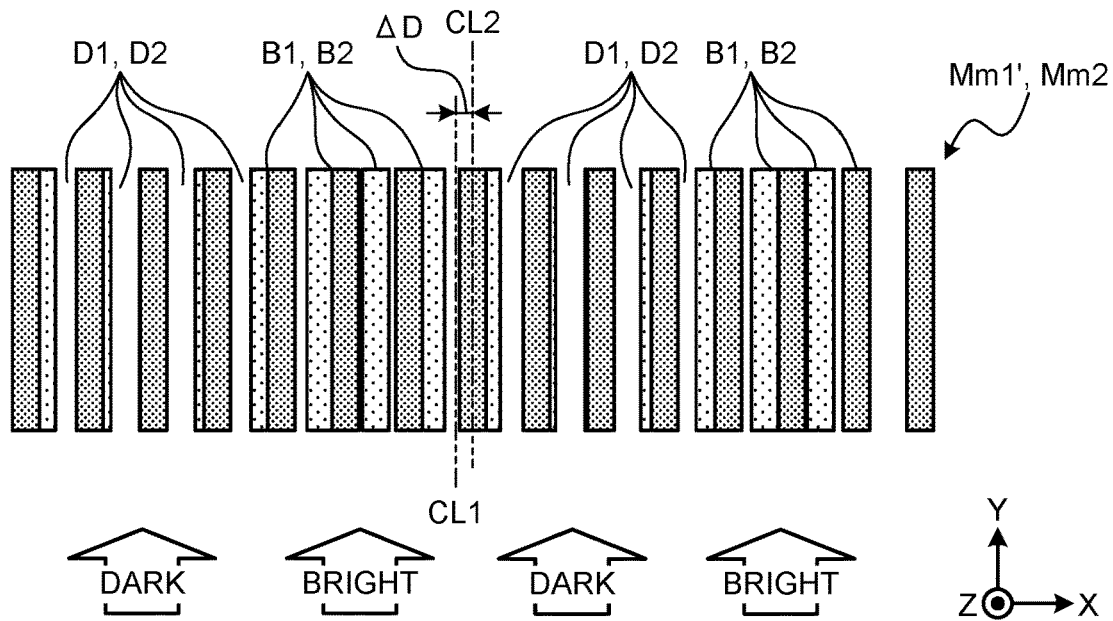
FIG. 8 is a diagram illustrating an example of moiré in a case where the first moiré mark and the second moiré mark, which are inverted patterns according to the first embodiment, are not at normal positions.

FIG. 8 is a diagram illustrating an example of moiré in a case where the first moiré mark Mm1' and the second moiré mark Mm2, which are inverted patterns according to the first embodiment, are not at normal positions. Here, a case where the first moiré mark Mm1' has an inverted pattern will be described. Similarly to the situation illustrated in FIG. 6, FIG. 8 illustrates a moiré generated when the second moiré mark Mm2 is displaced from the normal position to the right side in the drawing by the distance ΔD, and the arrangement pattern of the bright portions B1 and the dark portions D1 of the first moiré mark Mm1' is inverted with respect to the arrangement pattern (normal pattern) of the first moiré mark Mm1 illustrated in FIG. 6. As illustrated in the comparison between FIGS. 6 and 8, even when the displacement amount (distance ΔD) is the same, when the arrangement pattern of the bright portions B1 and the dark portions D1 is inverted, the positions of the bright portion and the dark portion of the moiré change. Such a phenomenon can also occur in a case where there is inversion in the arrangement pattern of the bright portions B2 and the dark portions D2 in the second moiré mark Mm2.

The measurement method according to the present embodiment includes processing for removing the influence of the inversion of the bright portions B1 and B2 and the dark portions D1 and D2 of the first moiré mark Mm1 or the second moiré mark Mm2 as described above.

Figure 9:
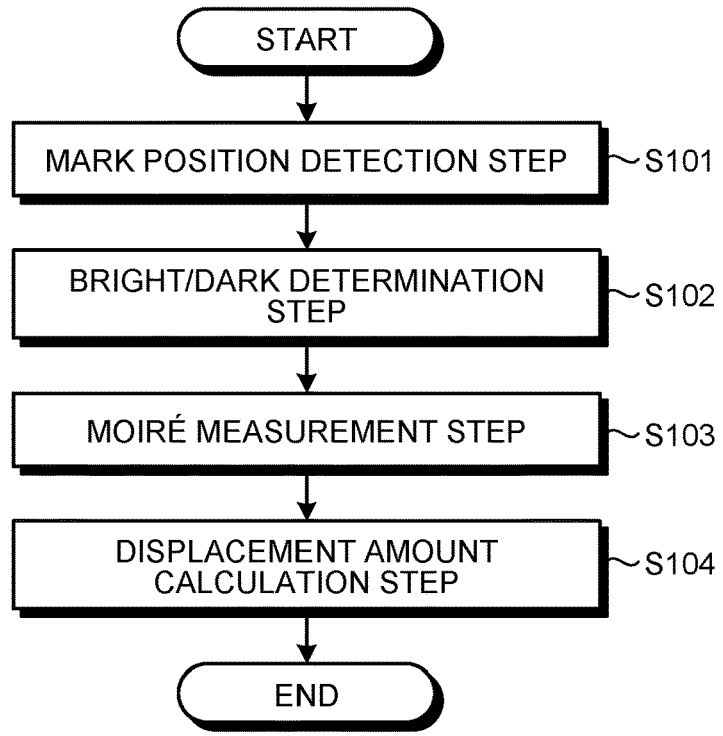
FIG. 9 is a flowchart illustrating an example of processing in a measurement method according to the first embodiment.

FIG. 9 is a flowchart illustrating an example of processing in the measurement method according to the first embodiment. The measurement method according to the present embodiment is a method for measuring the displacement between the first layer 12 and the second layer 13 constituting a part of the semiconductor device 1, and includes a mark position detection step (S101) of detecting the positions of the first mark M1 and the second mark M2. The mark position detection step can be performed on the basis of, for example, captured data obtained by imaging the second layer 13 from the upper surface after or during formation of the second layer 13. When the mark position detection step is executed after the formation of the second layer 13, an opening is formed in a portion of the second layer 13 corresponding to the position of the first mark M1 so that the first mark M1 formed on the first layer 12 can be imaged.

Thereafter, a bright/dark determination step (S102) of determining an arrangement pattern for at least one of the first moiré mark Mm1 or the second moiré mark Mm2 is executed. At this time, the arrangement pattern of the first moiré mark Mm1 (whether it is a normal pattern or an inverted pattern) is determined on the basis of the captured data of the first reference mark Ms1, and the arrangement pattern of the second moiré mark Mm2 is determined on the basis of the captured data of the second reference mark Ms2. The arrangement pattern of the first moiré mark Mm1 can be determined, for example, by specifying which portion in the first region Rat corresponds to the bright portions B1 on the basis of the optical characteristics (light intensity of reflected light, etc.) of the first reference mark Ms1. Similarly, the arrangement pattern of the second moiré mark Mm2 can be determined, for example, by specifying which portion in the second region Ra2 corresponds to the bright portions B2 on the basis of the optical characteristics of the second reference mark Ms2.

Thereafter, a moiré measurement step (S103) (an example of the mark measurement step) of measuring the moiré generated by overlapping the first moiré mark Mm1 with the second moiré mark Mm2 is executed. The moiré measurement step can be performed, for example, on the basis of captured data obtained by imaging the second layer 13 from the upper surface after formation of the second layer 13. At this time, the measurement result of the moiré is corrected on the basis of the determination result by the bright/dark determination step (arrangement pattern information) so as to remove the influence of the inversion of the arrangement pattern of the first moiré mark Mm1 and/or the second moiré mark Mm2.

Thereafter, a displacement amount calculation step (S104) of calculating a displacement amount (distance ΔD) between the first layer 12 (first moiré mark Mm1) and the second layer 13 (second moiré mark Mm2) on the basis of the measurement result of the moiré measurement step (moiré information) is executed. The moiré information is an example of mark position information indicating a relative positional relationship between the first moiré mark Mm1 and the second moiré mark Mm2. At this time, since the moiré information is corrected on the basis of the arrangement pattern of the first moiré mark Mm1 and/or the second moiré mark Mm2 in the moiré measurement step as described above, the displacement amount calculated here is obtained by removing the influence of the inversion of the arrangement pattern.

Figure 10:
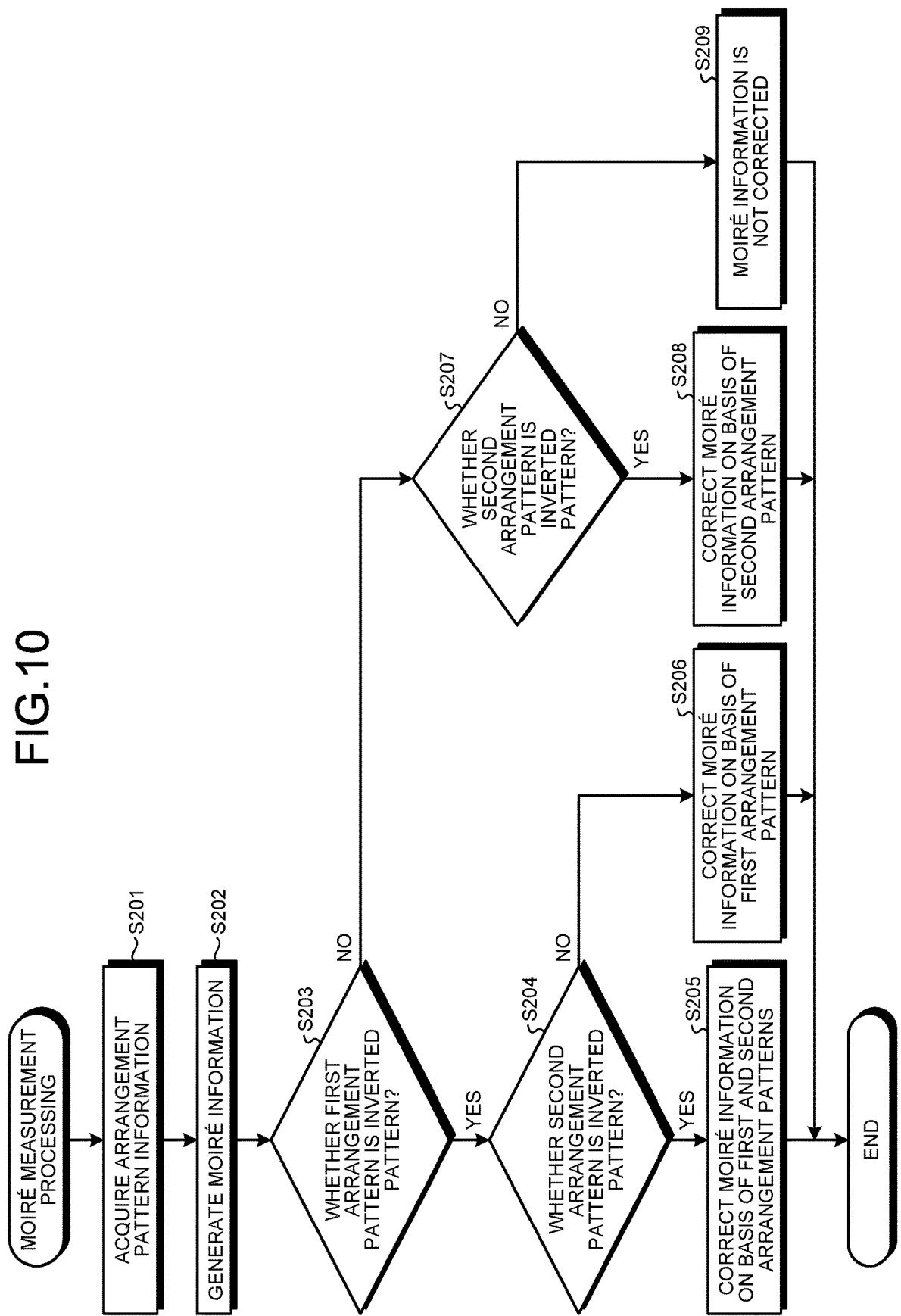
FIG. 10 is a flowchart illustrating an example of moiré measurement processing according to the first embodiment.

FIG. 10 is a flowchart illustrating an example of moiré measurement processing according to the first embodiment. When the moiré measurement step (S103) is started, the arrangement pattern information generated in the bright/dark determination step (S102) is acquired (S201), and moiré information regarding the moiré generated by overlapping the first moiré mark Mm1 with the second moiré mark Mm2 is generated (S202). The arrangement pattern information here includes information indicating the arrangement pattern of the first moiré mark Mm1 (first arrangement pattern) and information indicating the arrangement pattern of the second moiré mark Mm2 (second arrangement pattern). The moiré information includes information indicating the positions of the bright portion and the dark portion of the moiré generated by overlapping the first moiré mark Mm1 with the second moiré mark Mm2 (for example, a displacement amount of the moiré with respect to a predetermined position).

Thereafter, it is determined whether the first arrangement pattern is an inverted pattern (S203). When the first arrangement pattern is an inverted pattern (S203: Yes), it is further determined whether the second arrangement pattern is an inverted pattern (S204). When the second arrangement pattern is the inverted pattern (S204: Yes), the moiré information is corrected so as to remove the influence of the case where both the first arrangement pattern and the second arrangement pattern are inverted patterns (S205). In step S204, when the second arrangement pattern is not the inverted pattern (S204: No), the moiré information is corrected so as to remove the influence of the case where only the first arrangement pattern is the inverted pattern (S206).

In step S203, when the first arrangement pattern is not an inverted pattern (S203: No), it is determined whether the second arrangement pattern is an inverted pattern (S207). In step S207, when the second arrangement pattern is an inverted pattern (S207: Yes), the moiré information is corrected so as to remove the influence of the case where only the second arrangement pattern is an inverted pattern (S208). In step S207, when the second arrangement pattern is not an inverted pattern (S207: No), it is assumed that both the first arrangement pattern and the second arrangement pattern are normal patterns, and the moiré information is not corrected (S209).

According to the measurement method as described above, even when at least one of the first moiré mark Mm1 or the second moiré mark Mm2 is inverted, it is possible to accurately measure the displacement between the first layer 12 and the second layer 13.

Figure 11:
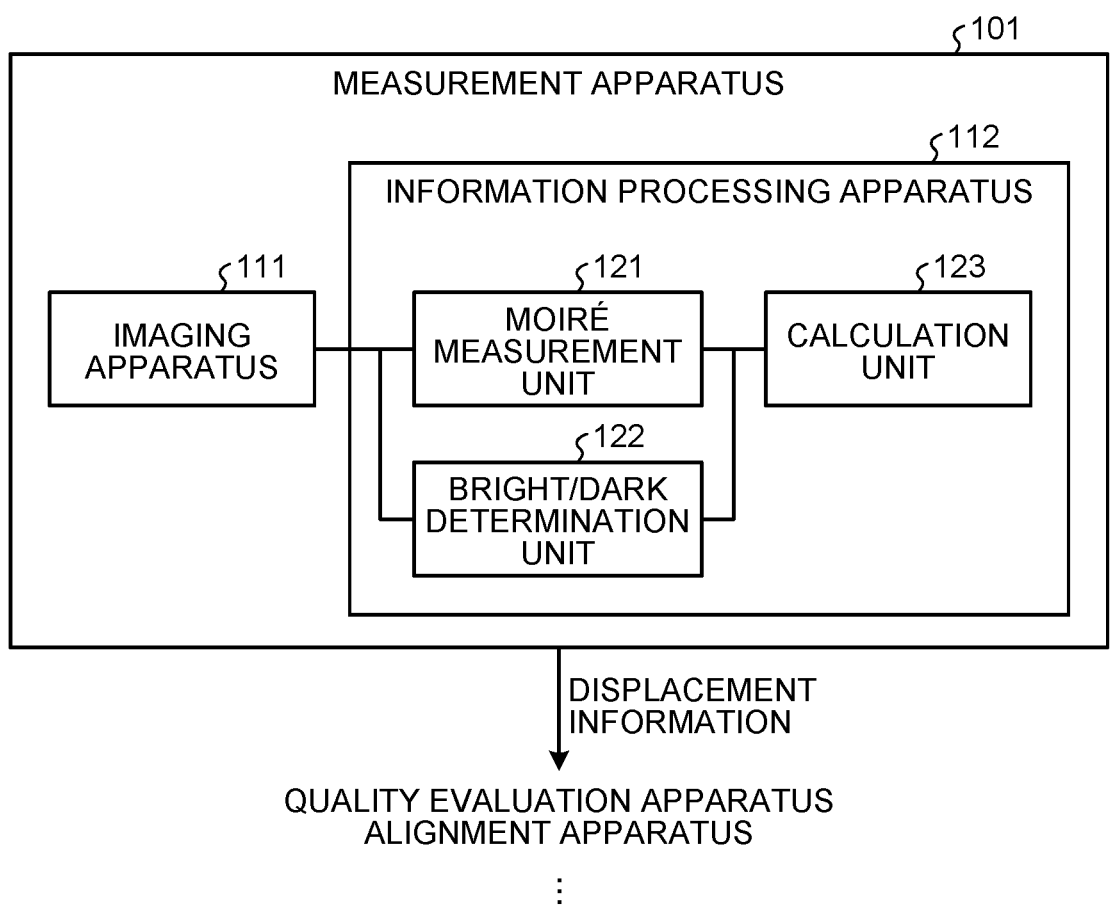
FIG. 11 is a block diagram illustrating an example of a configuration of a measurement apparatus according to the first embodiment.

FIG. 11 is a block diagram illustrating an example of a configuration of a measurement apparatus 101 according to the first embodiment. The measurement apparatus 101 according to the present embodiment is an apparatus that measures displacement between a plurality of layers constituting a semiconductor device and generates displacement information indicating a measurement result by executing the measurement method as described above.

The measurement apparatus 101 includes an imaging apparatus 111 and an information processing apparatus 112. The imaging apparatus 111 can be configured using, for example, a digital camera that images, from the upper surface, the semiconductor device 1 including the first layer 12 and the second layer 13 to be measured, an illumination mechanism that irradiates the first reference mark Ms1 and the second reference mark Ms2 with inspection light having a predetermined wavelength, and the like. The information processing apparatus 112 is, for example, a computer including a central processing unit (CPU), a read only memory (ROM), a random access memory (RAM), an auxiliary memory device, a user interface, a communication interface, and the like, and executes various types of arithmetic processing for realizing the measurement method according to a program stored in the ROM or the auxiliary memory device.

The information processing apparatus 112 includes a moiré measurement unit 121 (an example of a mark measurement unit), a bright/dark determination unit 122, and a calculation unit 123. The moiré measurement unit 121 generates moiré information on the basis of the captured data of the region where the first moiré mark Mm1 and the second moiré mark Mm2 overlap each other acquired by the imaging apparatus 111. The bright/dark determination unit 122 determines the arrangement pattern of the first moiré mark Mm1 on the basis of the captured data of the first reference mark Ms1 acquired by the imaging apparatus 111, and determines the arrangement pattern of the second moiré mark Mm2 on the basis of the captured data of the second reference mark Ms2 acquired by the imaging apparatus 111. The calculation unit 123 calculates the displacement amount between the first layer 12 and the second layer 13 on the basis of the measurement result by the moiré measurement unit 121 (moiré information) and the determination result by the bright/dark determination unit 122 (arrangement pattern information). At this time, the calculation unit 123 calculates the displacement amount so as to remove the influence of the inversion of the arrangement pattern of the first moiré mark Mm1 and/or the arrangement pattern of the second moiré mark Mm2. The displacement information including the displacement amount calculated in this manner can be used for various applications. The displacement information can be used in, for example, a quality evaluation apparatus that evaluates the quality of the manufactured semiconductor device 1, an alignment apparatus that adjusts the position of the substrate 11 in the manufacturing process of the semiconductor device 1, and the like.

Hereinafter, other embodiments will be described with reference to the drawings, but the same or similar parts as those of the first embodiment are denoted by the same reference numerals, and the description thereof may be omitted.

Second Embodiment

Figure 12:
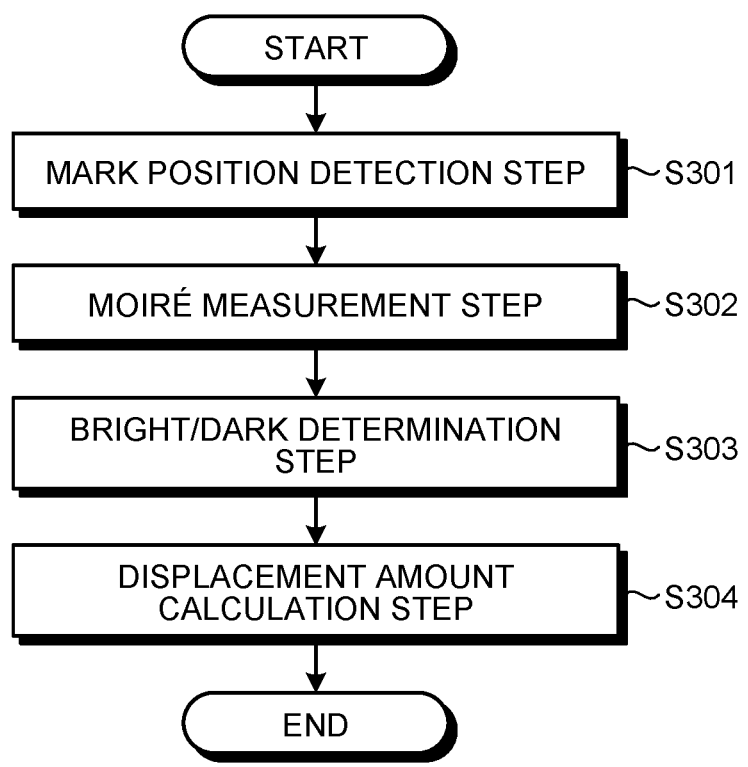
FIG. 12 is a flowchart illustrating an example of processing in a measurement method according to a second embodiment.

FIG. 12 is a flowchart illustrating an example of processing in a measurement method according to a second embodiment. In the measurement method according to the first embodiment (FIG. 9), the bright/dark measurement step is executed before the moiré measurement step is executed, but in the measurement method according to the present embodiment, the bright/dark measurement step is executed after the moiré measurement step is executed.

Also in the measurement method according to the present embodiment, similarly to the measurement method according to the first embodiment, first, the mark position detection step (S301) of detecting the positions of a first mark M1 and a second mark M2 is executed. Thereafter, a moiré measurement step (S302) of measuring the moiré generated by overlapping a first moiré mark Mm1 with a second moiré mark Mm2 is executed.

Thereafter, a bright/dark determination step (S303) of determining an arrangement pattern for at least one of the first moiré mark Mm1 or the second moiré mark Mm2 is executed. At this time, similarly to the first embodiment, the arrangement pattern of the first moiré mark Mm1 is determined on the basis of the captured data of a first reference mark Ms1, and the arrangement pattern of the second moiré mark Mm2 is determined on the basis of the captured data of a second reference mark Ms2.

Thereafter, a displacement amount calculation step (S304) of calculating a displacement amount (distance ΔD) between the first layer 12 (first moiré mark Mm1) and the second layer 13 (second moiré mark Mm2) is executed on the basis of the measurement result of the moiré measurement step (moiré information) and the determination result of the bright/dark determination step (arrangement pattern information). At this time, the displacement amount is calculated on the basis of the arrangement pattern information so as to remove the influence of the inversion of the arrangement pattern of the first moiré mark Mm1 and/or the second moiré mark Mm2.

Figure 13:
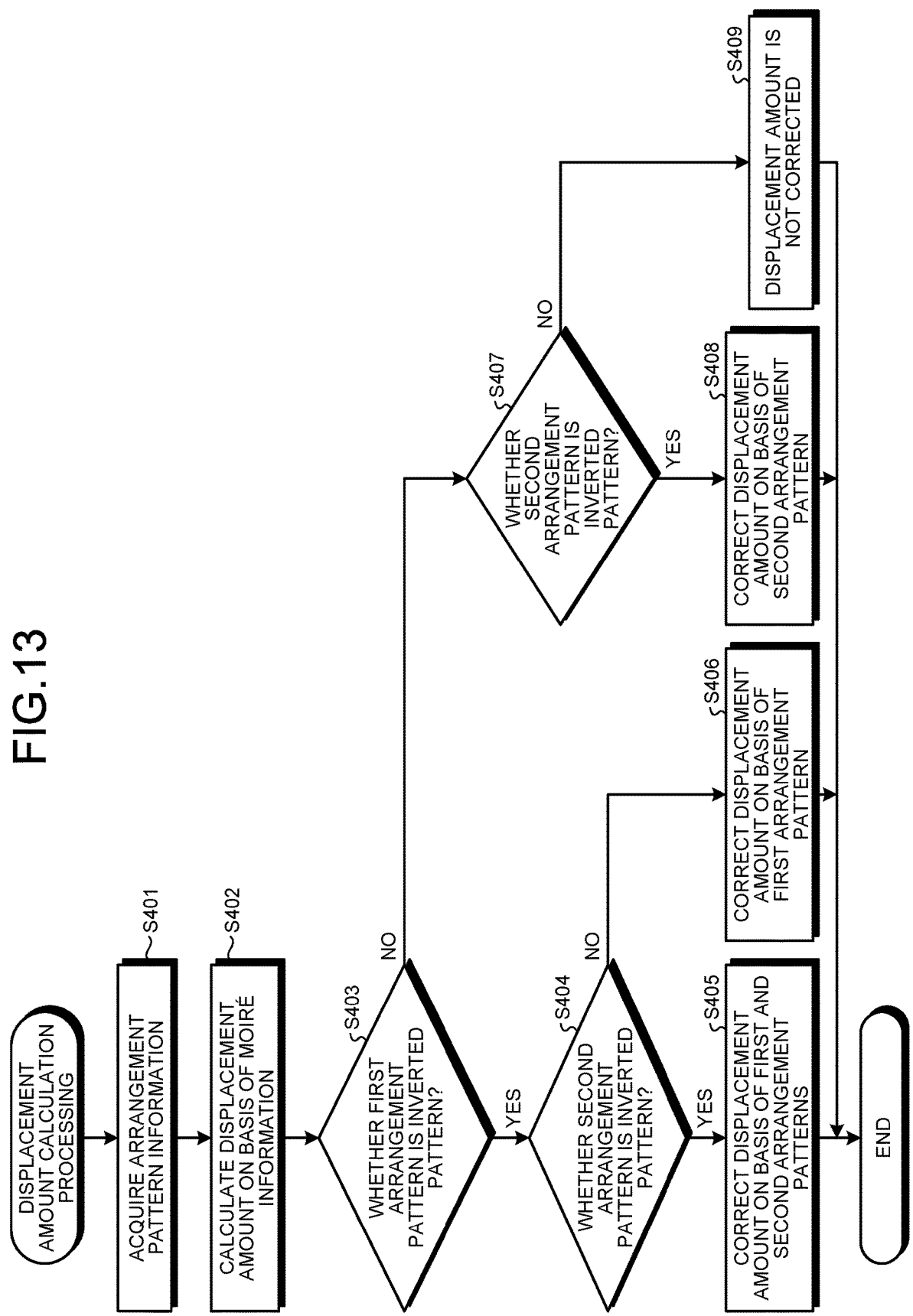
FIG. 13 is a flowchart illustrating an example of moiré measurement processing according to the second embodiment.

FIG. 13 is a flowchart illustrating an example of moiré measurement processing according to the second embodiment. When the displacement amount calculation step (S304) is started, the arrangement pattern information generated in the bright/dark determination step (S303) is acquired (S401). Then, the displacement amount is calculated on the basis of the moiré information generated in the moiré measurement step (S302) (S402).

Thereafter, it is determined whether the first arrangement pattern is an inverted pattern (S403). When the first arrangement pattern is an inverted pattern (S403: Yes), it is further determined whether the second arrangement pattern is an inverted pattern (S404). When the second arrangement pattern is an inverted pattern (S404: Yes), the displacement amount is corrected so as to remove the influence of the case where both the first arrangement pattern and the second arrangement pattern are inverted patterns (S405). In step S404, when the second arrangement pattern is not an inverted pattern (S404: No), the displacement amount is corrected so as to remove the influence of the case where only the first arrangement pattern is an inverted pattern (S406).

In step S403, when the first arrangement pattern is not an inverted pattern (S403: No), it is determined whether the second arrangement pattern is an inverted pattern (S407). In step S407, when the second arrangement pattern is an inverted pattern (S407: Yes), the displacement amount is corrected so as to remove the influence of the case where only the second arrangement pattern is an inverted pattern (S408). In step S407, when the second arrangement pattern is not an inverted pattern (S407: No), it is assumed that both the first arrangement pattern and the second arrangement pattern are normal patterns, and the moiré information is not corrected (S409).

As described above, even if the bright/dark determination step is executed after the moiré measurement step is executed, it is possible to remove the influence of the inversion of the arrangement pattern of the first moiré mark Mm1 and/or the second moiré mark Mm2 and to measure the displacement between the first layer 12 and the second layer 13 with high accuracy.

Third Embodiment

Figure 14:
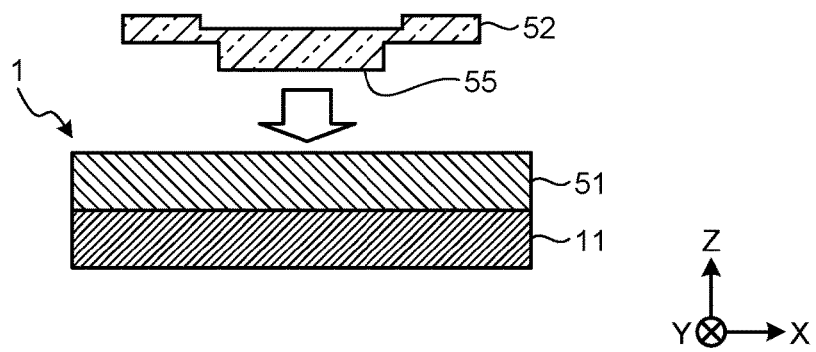
FIG. 14 is a diagram schematically illustrating an example of a manufacturing process of a semiconductor device according to a third embodiment.

FIG. 14 is a diagram schematically illustrating an example of a manufacturing process of a semiconductor device 1 according to a third embodiment. The semiconductor device 1 according to the present embodiment is manufactured using an imprinting method. The manufacturing process of the semiconductor device 1 according to the present embodiment includes a step of forming a predetermined pattern on the upper surface of a member 51 (an example of the first member) to be processed by bringing a shot region 55 of a template 52 (an example of the second member) into contact with the upper surface of the member 51 to be processed formed on the substrate 11. The template 52 is made of a translucent material.

In the present embodiment, a technique for measuring the displacement between the member 51 to be processed and the template 52 will be described. Marks for measuring displacement between the member 51 to be processed and the template 52 (a first mark and a second mark to be described later) are formed on each of the member 51 to be processed and the template 52.

Figure 15:
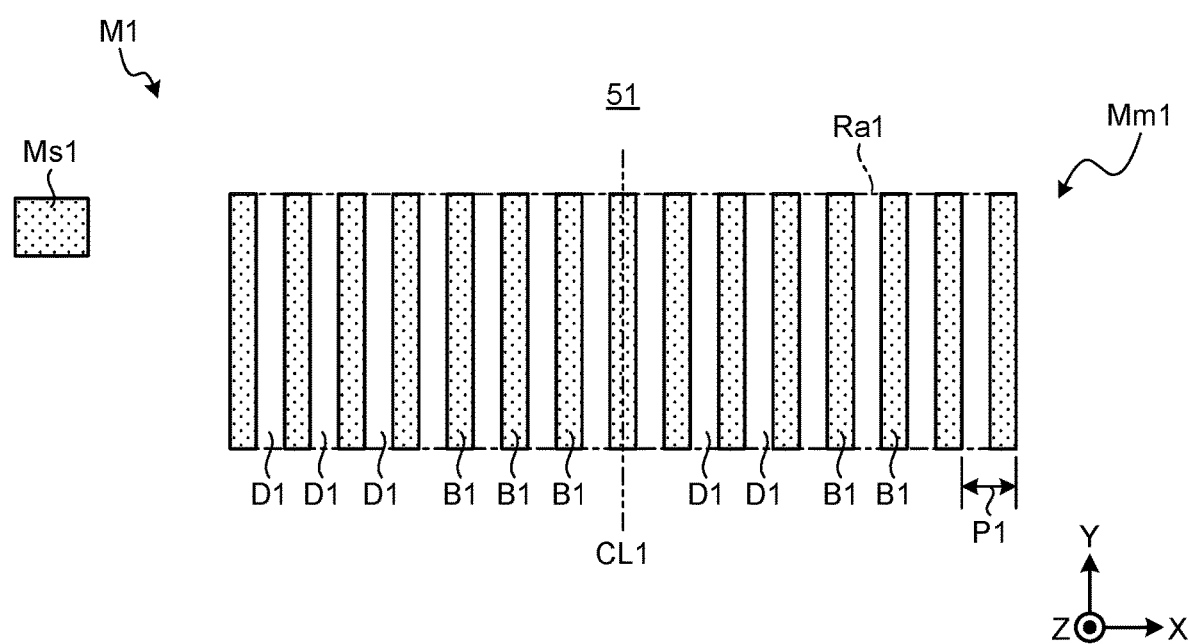
FIG. 15 is a top view illustrating an example of a configuration of a first mark according to the third embodiment.
Figure 16:
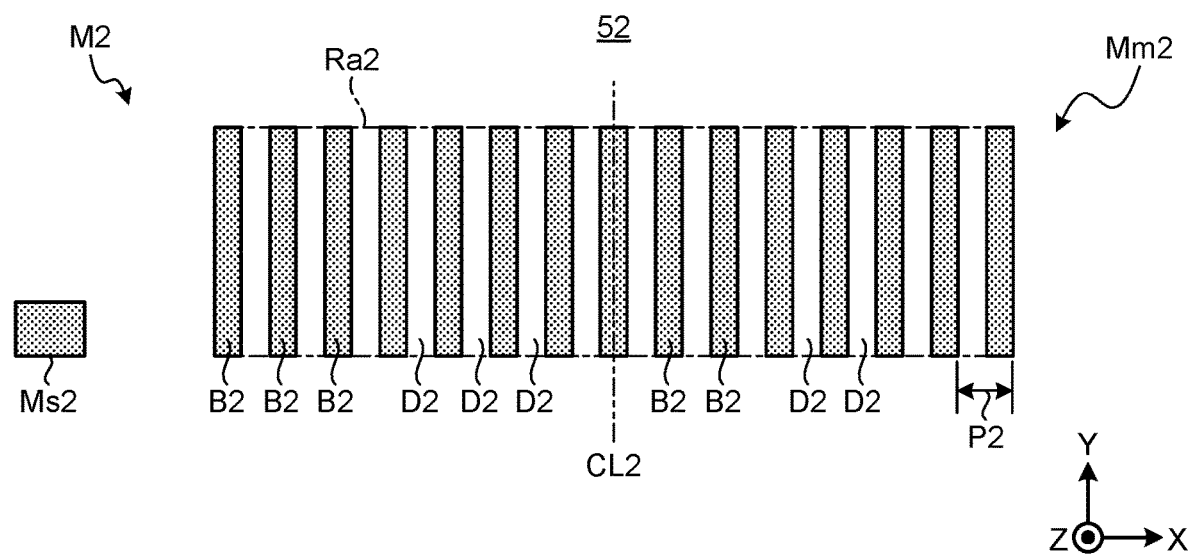
FIG. 16 is a top view illustrating an example of a configuration of a second mark according to the third embodiment.

FIG. 15 is a top view illustrating an example of a configuration of a first mark M1 according to the third embodiment. FIG. 16 is a top view illustrating an example of a configuration of a second mark M2 according to the third embodiment. The first mark M1 is formed on the upper surface of the member 51 to be processed, and is formed, for example, in a region other than the region in contact with the shot region 55 of the template 52. The second mark M2 is formed on the lower surface of the template 52, and is formed, for example, in a region other than the shot region 55.

As illustrated in FIG. 15, the first mark M1 according to the present embodiment includes a first moiré mark Mm1 and a first reference mark Ms1 having functions similar to the functions of the first embodiment. The first moiré mark Mm1 is a mark for generating moiré by overlapping with a second moiré mark Mm2 (FIG. 16) to be described later, and includes a plurality of bright portions B1 and a plurality of dark portions D1. How to specifically form the bright portions B1 and the dark portions D1 should be appropriately selected according to the configuration of the semiconductor device 1. For example, the bright portions B1 may be configured by a region in which a metal such as tungsten is disposed, and the dark portions D1 may be configured by a region in which no metal is disposed (a silicon oxide film or the like is exposed). The first reference mark Ms1 according to the present embodiment has optical characteristics corresponding to the bright portions B1 of the first moiré mark Mm1, and is made of the same material as the bright portions B1. The first reference mark Ms1 may be used for rough alignment for preliminarily adjusting the positions of the member 51 to be processed and the template 52.

As illustrated in FIG. 16, the second mark M2 according to the present embodiment includes the second moiré mark Mm2 and a second reference mark Ms2 having functions similar to those of the second embodiment. The second moiré mark Mm2 is a mark for generating moiré by overlapping with the first moiré mark Mm1 (FIG. 15), and includes a plurality of bright portions B2 and a plurality of dark portions D2. How to specifically form the bright portions B2 and the dark portions D2 should be appropriately selected according to the configuration of the template 52, however for example, the bright portions B2 can be configured by a region in which metal such as tungsten is disposed, and the dark portions D1 can be configured by a region in which metal is not disposed (made of quartz or the like). The second reference mark Ms2 according to the present embodiment has optical characteristics corresponding to the bright portions B2 of the second moiré mark Mm2, and is made of the same material as the bright portions B2. The second reference mark Ms2 may be used for rough alignment for preliminarily adjusting the positions of the member 51 to be processed and the template 52.

As described above, by forming the first mark M1 on the member 51 to be processed, forming the second mark M2 on the template 52, and executing the measurement method similarly to the first embodiment, the influence of the inversion of the arrangement pattern of the first moiré mark Mm1 and/or the second moiré mark Mm2 can be removed, and the displacement between the member 51 to be processed and the template 52 can be measured with high accuracy.

Fourth Embodiment

Figure 17:
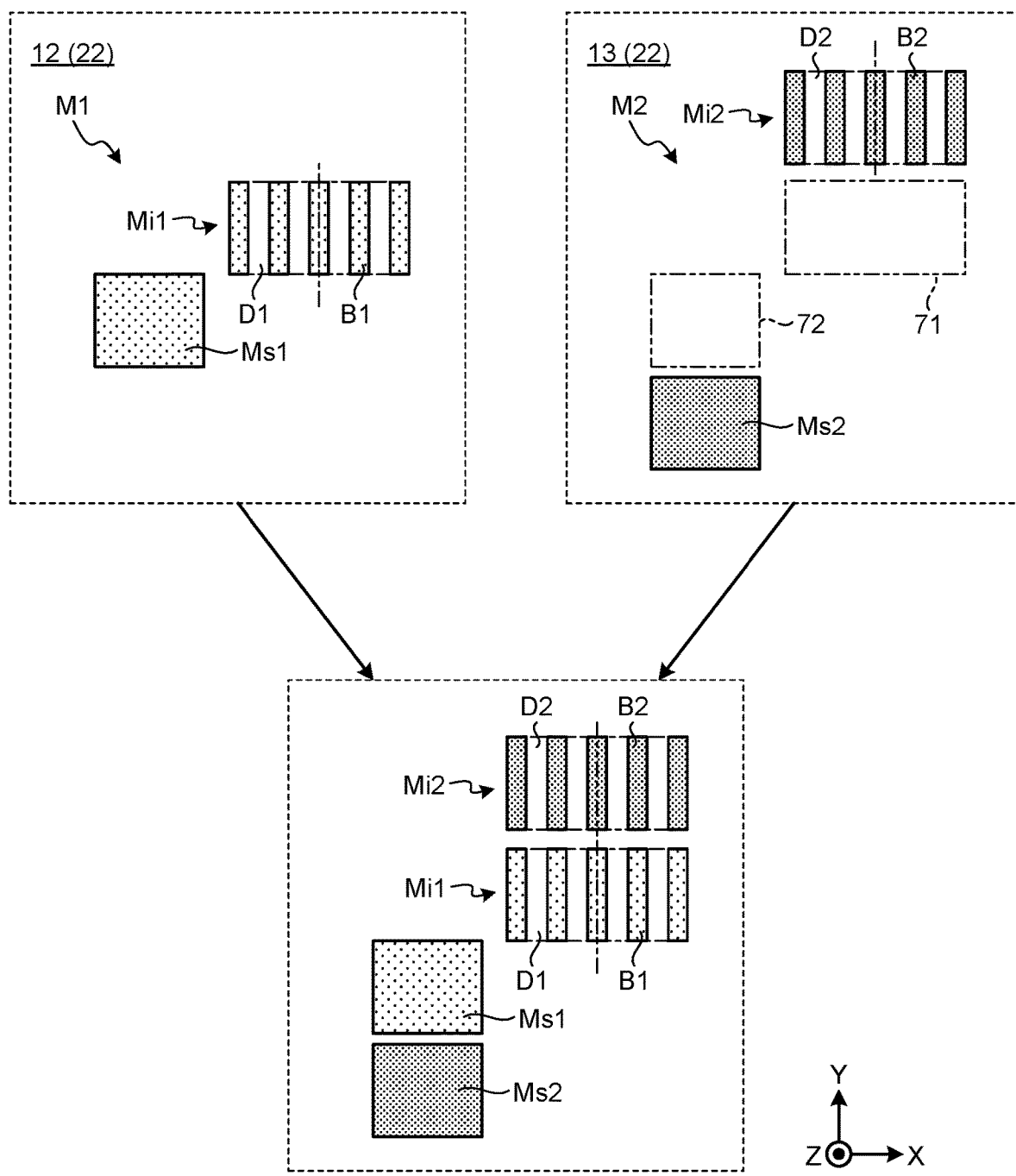
FIG. 17 is a diagram illustrating an example of configurations of the first mark and the second mark used in a measurement method according to a fourth embodiment.

FIG. 17 is a diagram illustrating an example of configurations of a first mark M1 and a second mark M2 used in a measurement method according to a fourth embodiment. The present embodiment relates to a technique for measuring the displacement between the first layer 12 and the second layer 13 of the semiconductor device 1 similarly to the first embodiment, but is different from the first embodiment in that moiré is not used.

As illustrated in the upper left part of FIG. 17, the first mark M1 formed on the first layer 12 (for example, a kerf region 22) of the present embodiment includes a first alignment mark Mi1 and a first reference mark Ms1. The first alignment mark Mi1 is configured such that a plurality of bright portions B1 and a plurality of dark portions D1 extending in the Y axis direction are alternately arranged in the X axis direction at a predetermined pitch. The first reference mark Ms1 has optical characteristics corresponding to the bright portions B1. With such a configuration, similarly to the first embodiment, the arrangement pattern of the bright portions B1 and the dark portions D1 in the first alignment mark Mi1 can be determined on the basis of the captured data of the first reference mark Ms1.

As illustrated in the upper right part of FIG. 17, the second mark M2 formed on the second layer 13 (for example, the kerf region 22) according to the present embodiment includes a second alignment mark Mi2 and a second reference mark Ms2. The second alignment mark Mi2 is configured such that the bright portions B2 and the dark portions D2 extending in the Y axis direction are alternately arranged in the X axis direction at the same pitch as the pitch of the first alignment mark Mi1. The second reference mark Ms2 has optical characteristics corresponding to the bright portions B2. With such a configuration, similarly to the first embodiment, the arrangement pattern of the bright portions B2 and the dark portions D2 in the second alignment mark Mi2 can be determined on the basis of the captured data of the second reference mark Ms2. Further, the second mark M2 is provided with a first opening 71 and a second opening 72. The first opening 71 is formed in a region corresponding to the formation position of the first alignment mark Mi1 when the second layer 13 is formed on the first layer 12. The second opening 72 is formed in a region corresponding to the formation position of the first reference mark Ms1 when the second layer 13 is formed on the first layer 12. With such a configuration, after the second layer 13 is formed on the first layer 12, the first alignment mark Mi1 and the first reference mark Ms1 can be observed from the upper surface of the second layer 13.

In the lower part of FIG. 17, a state in which the first layer 12 and the second layer 13 are stacked without displacement is illustrated. At this time, the bright portions B1 and the dark portions D1 of the first alignment mark Mi1 and the bright portions B2 and the dark portions D2 of the second alignment mark Mi2 are linearly arranged in the Y axis direction. After the formation of the second layer 13, the displacement between the first layer 12 and the second layer 13 can be measured by analyzing whether or not the positional relationship between the first alignment mark Mi1 and the second alignment mark Mi2 is in such a state on the basis of the captured data or the like. Similarly to the first embodiment, the arrangement pattern of the first alignment marks Mi1 can be determined on the basis of the captured data of the first reference mark Ms1, and the arrangement pattern of the second alignment marks Mi2 can be determined on the basis of the captured data of the second reference mark Ms2. As a result, even in a case where the moiré is not used, the influence of the inversion of the arrangement pattern of the bright portions and the dark portions can be removed, and the displacement between the plurality of layers can be measured with high accuracy.

The configuration of the fourth embodiment can also be applied to the measurement of the displacement between the member 51 to be processed and the template 52 as in the third embodiment.

A program for causing a computer to execute various processes and functions described in the above-described embodiments is provided by being recorded in a computer-readable recording medium such as a CD-ROM, a flexible disk (FD), a CD-R, or a digital versatile disk (DVD) as a file in an installable format or an executable format. Alternatively, the program may be stored on a computer connected to a network such as the Internet and provided by being downloaded via the network. In addition, the program may be provided or distributed via a network such as the Internet. In addition, the program may be provided by being incorporated in a ROM or the like in advance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A measurement method comprising:
   generating mark position information indicating relative positional relationship between a first alignment mark which is formed in a first member and which includes bright portions and dark portions, and a second alignment mark which is formed in a second member and which includes bright portions and dark portions;
   determining at least one of a first arrangement pattern indicating an arrangement pattern of the bright portions and the dark portions of the first alignment mark or a second arrangement pattern indicating an arrangement pattern of the bright portions and the dark portions of the second alignment mark on a basis of captured data of a reference mark formed in a region different from a region where the first alignment mark is formed and a region where the second alignment mark is formed; and
   calculating displacement between the first member and the second member on a basis of the mark position information and at least one of the first arrangement pattern or the second arrangement pattern.

2. The measurement method according to claim 1, wherein the reference mark includes a first reference mark formed at a position separate from the first alignment mark by a predetermined distance in the first member.

3. The measurement method according to claim 2, wherein the predetermined distance is equal to or less than 20 µm.

4. The measurement method according to claim 2, wherein the first alignment mark is constituted by a plurality of bright portions and a plurality of dark portions extending in a first direction being alternately arranged in a second direction which intersects with the first direction, and
   a width of the first reference mark in the second direction is greater than a width of each of the bright portions of the first alignment mark in the second direction and a width of each of the dark portions of the first alignment mark in the second direction.

5. The measurement method according to claim 4,
wherein the width of the first reference mark in the second direction is equal to or greater than 1.5 μm.

6. The measurement method according to claim 5,
wherein a margin region having optical characteristics different from optical characteristics of the first reference mark is provided around the first reference mark, and
a width of the margin region in the second direction is equal to or greater than 1.5 μm.

7. The measurement method according to claim 2,
wherein the first reference mark has optical characteristics corresponding to one of the bright portions or the dark portions of the first alignment mark.

8. The measurement method according to claim 1,
wherein at least one of the first arrangement pattern or the second arrangement pattern is determined before the mark position information is generated.

9. The measurement method according to claim 1,
wherein at least one of the first arrangement pattern or the second arrangement pattern is determined after the mark position information is generated.

10. The measurement method according to claim 1,
wherein the mark position information is generated on a basis of moiré which occurs by a region where the first alignment mark overlaps with the second alignment mark in a stack direction being irradiated with light.

11. The measurement method according to claim 1,
wherein the mark position information is generated on a basis of whether or not the bright portions and the dark portions of the first alignment mark and the bright portions and the dark portions of the second alignment mark are arranged in a straight line.

12. The measurement method according to claim 6,
wherein the optical characteristics are reflectance with respect to light having a predetermined wavelength.

13. The measurement method according to claim 6,
Wherein the second member is a layer formed on the first member or a template contacted with the first member.

14. A measurement apparatus comprising:
an information processing apparatus configured to:
generate mark position information indicating relative positional relationship between a first alignment mark which is formed in a first member and which includes bright portions and dark portions, and a second alignment mark which is formed in a second member and which includes bright portions and dark portions after forming the second member on the first member;
determine at least one of a first arrangement pattern indicating an arrangement pattern of the bright portions and the dark portions of the first alignment mark or a second arrangement pattern indicating an arrangement pattern of the bright portions and the dark portions of the second alignment mark by specifying optical characteristics of the first alignment mark or the second alignment mark on a basis of captured data of a reference mark, the reference mark being formed in a region different from a region where the first alignment mark is formed and different from a region where the second alignment mark is formed; and
calculate displacement between the first member and the second member on a basis of the mark position information and at least one of the first arrangement pattern or the second arrangement pattern.

\* \* \* \* \*